United States Patent
Ferrer Luppi et al.

(10) Patent No.: US 10,263,065 B2
(45) Date of Patent: Apr. 16, 2019

(54) METAL RESISTOR FORMING METHOD USING ION IMPLANTATION

(71) Applicant: GLOBALFOUNDRIES INC., Grand Cayman (KY)

(72) Inventors: Domingo A. Ferrer Luppi, Fishkill, NY (US); Aritra Dasgupta, Clifton Park, NY (US); Benjamin G. Moser, Malta, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 207 days.

(21) Appl. No.: 14/932,441

(22) Filed: Nov. 4, 2015

(65) Prior Publication Data

US 2017/0125509 A1 May 4, 2017

(51) Int. Cl.
*H01L 49/02* (2006.01)
(52) U.S. Cl.
CPC ................... *H01L 28/24* (2013.01)
(58) Field of Classification Search
CPC ........................................................ H01L 28/24
See application file for complete search history.

(56) References Cited

U.S. PATENT DOCUMENTS

| | | | |
|---|---|---|---|
| 3,898,607 A | 8/1975 | Gurev et al. | |
| 4,446,613 A | 5/1984 | Beinglass et al. | |
| 4,609,903 A | 9/1986 | Toyokura et al. | |
| 4,662,058 A * | 5/1987 | Cirillo, Jr. | H01L 29/475 257/E21.407 |
| 4,746,621 A | 5/1988 | Thomas et al. | |
| 4,760,369 A | 7/1988 | Tiku | |
| 4,907,066 A | 3/1990 | Thomas et al. | |
| 6,143,613 A * | 11/2000 | Lin | H01L 21/28052 257/E21.004 |
| 6,165,861 A | 12/2000 | Liu et al. | |
| 6,984,869 B2 | 1/2006 | Erickson et al. | |
| 6,993,828 B2 | 2/2006 | Ha et al. | |
| 7,416,951 B2 | 8/2008 | Beach et al. | |
| 7,611,956 B2 | 11/2009 | Kim et al. | |
| 2002/0000635 A1 * | 1/2002 | Liu | H01L 21/28518 257/509 |
| 2006/0138597 A1 | 6/2006 | Johnson | |
| 2010/0085792 A1 * | 4/2010 | Matsuzaki | G11C 11/4023 365/72 |
| 2013/0207221 A1 | 8/2013 | McMullan et al. | |
| 2014/0175609 A1 | 6/2014 | Montanini et al. | |

* cited by examiner

*Primary Examiner* — Fernando L Toledo
*Assistant Examiner* — Neil R Prasad
(74) *Attorney, Agent, or Firm* — Anthony Canale; Hoffman Warnick LLC

(57) ABSTRACT

Methods of forming a metal resistor are provided. The methods may include: depositing a metal layer, e.g., tungsten, on a substrate; and forming the metal resistor by implanting a semiconductor species, e.g., silicon and/or germanium, into the metal layer to form a semiconductor-metal alloy layer from at least a portion of the metal layer. In certain embodiments, an adhesion layer may be deposited by ALD prior to metal layer depositing. The metal resistor has a sheet resistance that remains substantially constant prior to and after subsequent annealing.

20 Claims, 2 Drawing Sheets

METAL RESISTOR FORMING METHOD USING ION IMPLANTATION

BACKGROUND

Technical Field

The present disclosure relates to metal resistors, and more specifically, to methods of forming a metal resistor with lower temperature coefficient of resistance (TCR) and low sheet resistance using ion implantation.

Related Art

Metal resistors are widely used in integrated circuit fabrication processes. For example, precision metal resistors are employed as resistors and electronic fuses (e-fuses) within integrated circuits to enable advanced functionalities that improve performance, provide memory on passive devices, provide chip identification, etc. Current metal resistor processing includes depositing a conductor on a substrate, e.g., silicon dioxide ($SiO_2$), and annealing to stabilize the material. Current processing typically uses a tungsten silicide, $WSi_{2.7}$, as the conductor. The conventional processing is disadvantageous because it creates a high temperature coefficient of resistance (TCR) and a relatively high resistivity. Temperature coefficient of resistance (TCR) describes the relative change of resistance that is associated with a given change in temperature. One approach to solve these issues is to employ other materials with lower TCR, but these materials are typically not compatible with semiconductor integration flow. For example, use of silicide $WSi_{2.2}$ has been attempted, but it exhibits high non-uniformity and thus is difficult to employ.

SUMMARY

A first aspect of the disclosure is directed to a method of forming a metal resistor, the method including: depositing a metal layer on a substrate; and forming the metal resistor by implanting a semiconductor species into the metal layer to form a semiconductor-metal alloy layer from at least a portion of the metal layer.

A second aspect of the disclosure includes a method of forming a metal resistor, the method including: atomic layer depositing an adhesion layer on a dielectric upper layer of a substrate; chemical vapor depositing a tungsten (W) layer over the adhesion layer; and forming the metal resistor by implanting a silicon into the tungsten layer to form a tungsten silicide layer from at least a portion of the tungsten layer, the tungsten silicide layer including $WSi_{2.7}$.

A third aspect of the disclosure related to a method of forming a metal resistor, the method including: atomic layer depositing an adhesion layer on a dielectric upper layer of a substrate, the adhesion layer including titanium nitride (TiN); chemical vapor depositing a tungsten (W) layer over the adhesion layer, the metal layer having a thickness of approximately 140-180 Angstroms (Å); forming the metal resistor by implanting a silicon species into the tungsten layer to form a tungsten silicide layer from at least a portion of the tungsten layer, wherein the tungsten silicide layer includes $WSi_{2.7}$ and the implanting has a dose in a range of approximately $10^{12}$ to $10^{15}$ atoms/square centimeter (atoms/$cm^2$) and an energy in a range of approximately 2 to 3 kilo-electronVolts (keV); and annealing the metal resistor, wherein the metal resistor has a sheet resistance of approximately 300-350 ohms/square ($\Omega$/sq) prior to and after the annealing.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

DETAILED DESCRIPTION

Embodiments of a method of forming a metal resistor are described herein. The methods include ion implanting a semiconductor species into a metal layer to form a metal resistor. Embodiments of the method according to the disclosure may reduce the thermal coefficient of resistance (TCR) from a typical range of, e.g., 500-800 parts per million per degree Celsius (ppm/° C.), by approximately 20% with high tune-ability and decreased sheet resistance by approximately 20% with tungsten silicide, $WSi_{2.7}$. The embodiments of the disclosure can provide these features with broad adjustability and no change in the integration scheme, and without additional tooling. Ion implantation of semiconductor species can be used to promote a controlled alloying of a tungsten (W) layer, e.g., chemical vapor deposited W. By using different doses and energies of ion implantation the composition of the tungsten film can be tuned to adjust the resistivity and TCR. Consequently, the teachings of this disclosure can preserve the deposition uniformity across wafers, while lowering both TCR and sheet resistance.

Figure 1:
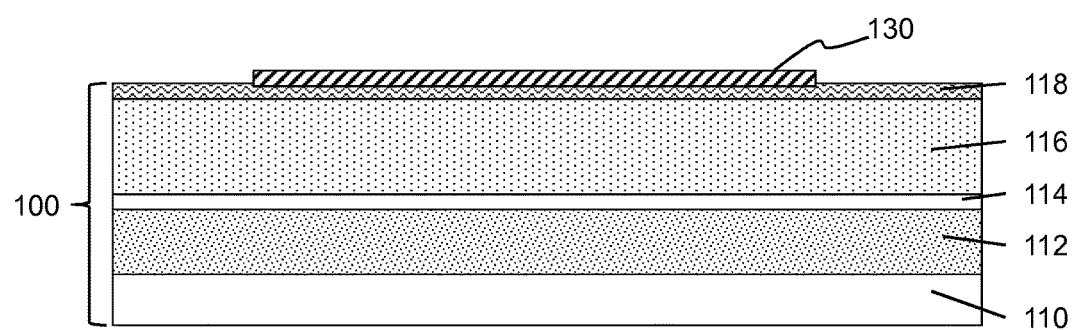
FIGS. 1-4 show cross-sections of methods of forming a metal resistor, with FIG. 4 showing a cross-section of the metal resistor, according to embodiments of the disclosure.
Figure 2:
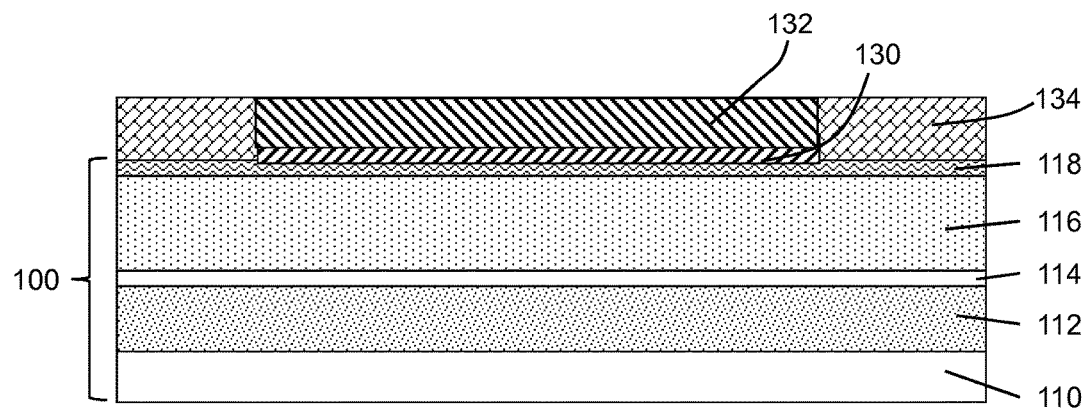
Figure 3:
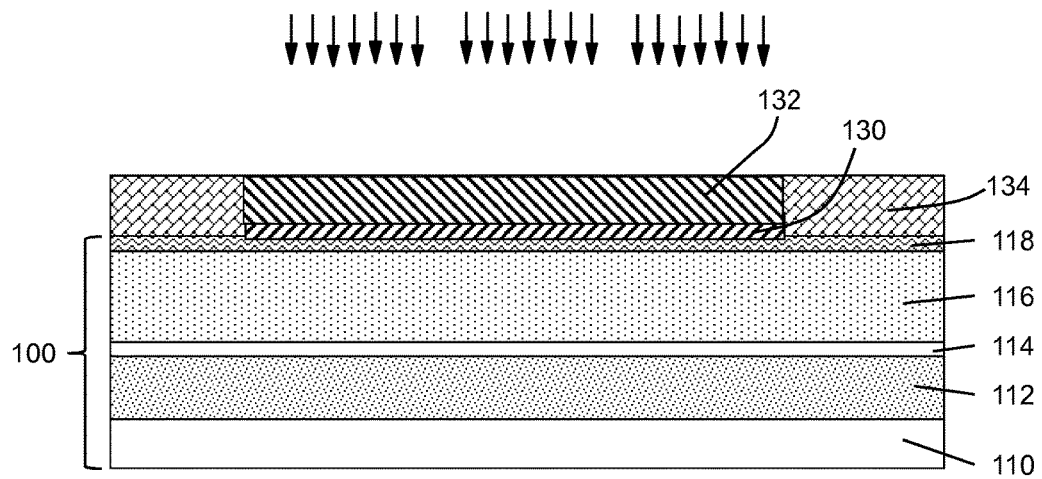
Figure 4:
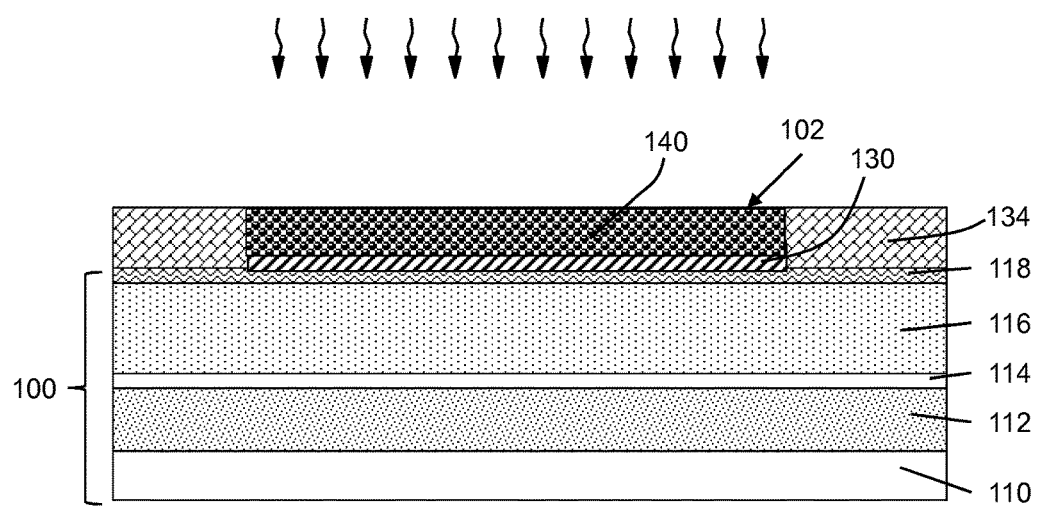

Referring to the drawings, FIGS. 1-4 show cross-sections of methods of forming a metal resistor, with FIG. 4 showing a cross-section of the metal resistor, according to embodiments of the disclosure. In FIG. 1, a substrate 100 is provided upon which metal resistor 102 (FIG. 4) according to embodiments of the disclosure will be formed. As will be recognized by those with skill in the art, substrate 100 can take a large variety of forms, and need not include all of the layers illustrated. In the example shown, substrate 100 includes a semiconductor-on-insulator (SOI) substrate including a semiconductor substrate 110, a buried insulator layer 112 (e.g., of silicon dioxide (SiO2)) over semiconductor substrate 110, and a semiconductor-on-insulator (SOI) layer 114 over BOX layer 112. Although not shown, SOI layer 114 may include a variety of semiconductor devices, e.g., transistors, etc. Semiconductor substrate 110 and SOI layer 114 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, SOI layer 114 may be strained.

Substrate 100 may further include an interlayer dielectric (ILD) layer 116 over SOI layer 114. ILD layer 116 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In one embodiment, a dielectric upper layer 118 of substrate 100 (i.e., of ILD layer 116) upon which metal resistor 102 (FIG. 4) is formed may include, for example, silicon nitride ($Si_3N_4$) or silicon dioxide ($SiO_2$).

Substrate 100 may be formed using any now known or later developed techniques, e.g., deposition, photolithography (patterning, etching, etc.), etc. As used herein, unless otherwise stated, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 also shows an optional step of depositing an adhesion layer 130 on dielectric upper layer 118 of substrate 100. In one embodiment, adhesion layer 130 may include titanium nitride (TiN) or organometallic tungsten (W), which acts to adhere a next-to-be-formed metal layer to dielectric upper layer 118. Adhesion layer 130 may be deposited using ALD. For example, adhesion layer may be deposited using 10-15 cycles of atomic layer deposition (ALD) titanium nitride (TiN) or atomic layer deposited (ALD) organometallic tungsten (W).

FIG. 2 shows depositing a metal layer 132 on substrate 100. Where adhesion layer 130 is employed metal layer 132 is over the adhesion layer. In one embodiment, metal layer 132 includes tungsten (W), but other resistor metals may also be employed. The metal layer depositing may include CVD. In one embodiment, metal layer 132 may have a thickness of approximately 140-180 Angstroms (Å). As used herein, "approximately" indicates +/−10% on the value stated or in the case of a range, either value stated. In one embodiment, metal layer 132 has a thickness of approximately 160 Å. As shown in FIG. 2, adhesion layer 130 and/or metal layer 132 may be surrounded by another ILD layer 134, i.e., prior to deposition or thereafter.

FIGS. 3-4 show forming metal resistor 102 (FIG. 4 only) by implanting semiconductor species such as silicon (Si) and/or germanium (Ge) into metal layer 132 to form a semiconductor-metal alloy layer 140 (FIG. 4) from at least a portion of metal layer 132. While semiconductor-metal alloy layer 140 is shown as consuming all of metal layer 132, it is understood that semiconductor-metal alloy layer 140, depending on the dose and energy of ion implanting, may cover a remaining portion of metal layer 132 over adhesion layer 130. Semiconductor-metal alloy layer 140 includes a semiconductor-metal alloy of whatever metal is used in metal layer 132, e.g., tungsten silicide ($WSi_x$) where metal layer 132 includes tungsten and the semiconductor species includes silicon, or tungsten-germanium (WGe) where semiconductor species includes germanium. In one embodiment, the ion implanting, shown in FIG. 3, may have a dose in range of approximately $10^{12}$ to $10^{15}$ atoms/square centimeter ($atoms/cm^2$). Further, the ion implanting may use an energy in a range of approximately 2 to 3 kilo-electronVolts (keV). In any event, in contrast to conventional metal resistor forming processes, the ion implanting dose and energy can be customized to tailor the formation of semiconductor-metal alloy layer 140. In one embodiment, where tungsten silicide is formed, it may include $WSi_{2.7}$; however, other combinations can also be employed. Further, the ion implanting dose and energy can be customized to create a desired sheet resistance, which in one example may be approximately 300-350 ohms/square ($\Omega/sq$) for the example metal layer thickness of 160 Å. Generally speaking, an increased silicon implantation dose or energy leads to increased sheet resistance.

In an alternative embodiment, also shown in FIG. 4, after either silicon or germanium ion implanting, other species may be ion implanted such as nitrogen ($N_2$).

Subsequently conventional back-end-of-line (BEOL) processes can also be carried out. As understood in the art, BEOL processes may include any operations performed on the semiconductor wafer in the course of device manufacturing following first metallization, e.g., to provide interconnects, fuses, resistors, size up the IC, etc. In one embodiment, as shown in FIG. 4, as part of forming metal resistor 102, further processing may include annealing to, among other things, stabilize semiconductor-metal alloy layer 140. In one embodiment, the annealing may include heating to approximately 400° C. in nitrogen (N). In contrast to conventional processing, the formation of metal resistor 102 as described herein, allows a sheet resistance of the metal resistor 102 to remain substantially consistent prior to and after the annealing, e.g., within 1-2% change.

Metal resistors 102 formed according to embodiments of the disclosure provide higher TCR and relatively higher resistivity compared to conventional metal resistors such as chemical vapor deposition (CVD) TiN, CVD WSi and physical vapor deposition (PVD) WSi. Embodiments of the disclosure may also include a metal resistor 102 having a tungsten silicide layer and a sheet resistance of greater than 300 $\Omega/sq$.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a metal resistor, the method comprising:
    forming a dielectric layer on a substrate;
    depositing an adhesion layer directly on the dielectric layer;
    depositing a tungsten layer directly on the adhesion layer; and
    forming the metal resistor by implanting a semiconductor species into the tungsten layer to form a semiconductor-tungsten alloy layer from at least a portion of the tungsten layer,
    wherein the dielectric layer electrically isolates a lower surface of the metal resistor from the substrate.

2. The method of claim 1, wherein the semiconductor species includes at least one of silicon and germanium.

3. The method of claim 1, further comprising ion implanting nitrogen into the semiconductor-tungsten alloy layer after implanting the semiconductor species, to form a nitrogen-containing semiconductor-tungsten alloy layer from at least a portion of the tungsten layer.

4. The method of claim 1, wherein the semiconductor species includes silicon and the semiconductor-metal alloy includes tungsten silicide ($WSi_x$).

5. The method of claim 4, wherein the tungsten silicide includes $WSi_{2.7}$.

6. The method of claim 1, wherein the adhesion layer includes one of titanium nitride and organometallic tungsten.

7. The method of claim 1, wherein the tungsten layer depositing includes chemical vapor deposition (CVD) and the adhesion layer depositing includes atomic layer deposition (ALD).

8. The method of claim 1, wherein the tungsten layer depositing includes chemical vapor depositing (CVD).

9. The method of claim 1, wherein the tungsten layer has a thickness of approximately 140-180 Angstroms (Å).

10. The method of claim 1, wherein the implanting has a dose in a range of approximately $10^{12}$ to $10^{15}$ atoms/square centimeter (atoms/cm$^2$).

11. The method of claim 1, wherein the implanting uses an energy in a range of approximately 2 to 3 kilo-electron-Volts (keV).

12. The method of claim 1, wherein the metal resistor has a sheet resistance of approximately 300-350 ohms/square ($\Omega$/sq).

13. The method of claim 1, wherein forming the metal resistor further includes annealing, and wherein a sheet resistance of the metal resistor remains substantially unchanged prior to and after the annealing.

14. A method of forming a metal resistor, the method comprising:
    forming a dielectric layer on a substrate;
    atomic layer depositing an adhesion layer directly on the dielectric layer;
    chemical vapor depositing a tungsten layer directly on the adhesion layer; and
    forming the metal resistor by implanting silicon into the tungsten layer to form a tungsten silicide layer from at least a portion of the tungsten layer, the tungsten silicide layer including $WSi_{2.7}$,
    wherein the tungsten silicide layer extends over at least half of an upper surface of the tungsten layer, and wherein the dielectric layer electrically isolates a lower surface of the metal resistor from the substrate.

15. The method of claim 14, wherein the tungsten layer has a thickness of approximately 140-180 Angstroms (Å).

16. The method of claim 14, wherein the implanting has a dose in a range of approximately $10^{12}$ to $10^{15}$ atoms/square centimeter (atoms/cm$^2$).

17. The method of claim 14, wherein the implanting uses an energy in a range of approximately 2 to 3 kilo-electron-Volts (keV).

18. The method of claim 14, wherein the metal resistor has a sheet resistance of approximately 300-350 ohms/square ($\Omega$/sq).

19. A method of forming a metal resistor, the method comprising:
    forming a dielectric layer on a substrate;
    atomic layer depositing an adhesion layer directly on the dielectric layer, the adhesion layer including titanium nitride (TiN);
    chemical vapor depositing a tungsten layer directly on the adhesion layer, the tungsten layer having a thickness of approximately 140-180 Angstroms (Å);
    forming the metal resistor by implanting silicon into the tungsten layer to form a tungsten silicide layer from at least a portion of the tungsten layer, wherein the tungsten silicide layer includes $WSi_{2.7}$, wherein the implanting has a dose in a range of approximately $10^{12}$ to $10^{15}$ atoms/square centimeter (atoms/cm$^2$) and an energy in a range of approximately 2 to 3 kilo-electronVolts (keV), wherein the tungsten silicide layer extends over at least half of an upper surface of the tungsten layer, and wherein the dielectric layer electrically isolates a lower surface of the metal resistor from the substrate; and
    annealing the metal resistor, wherein the metal resistor has a sheet resistance of approximately 300-350 ohms/square ($\Omega$/sq) prior to and after the annealing.

20. The method of claim 1, where in the semiconductor-tungsten alloy layer extends over at least half of an upper surface of the tungsten layer.

* * * * *